United States Patent [19]

Koinuma

[11] 4,451,802
[45] May 29, 1984

[54] POWER AMPLIFIER

[75] Inventor: Hirosi Koinuma, Tokyo, Japan

[73] Assignee: Pioneer Electronic Corporation, Tokyo, Japan

[21] Appl. No.: 387,311

[22] Filed: Jun. 11, 1982

[30] Foreign Application Priority Data

Jun. 17, 1981 [JP] Japan .................................. 56-93613

[51] Int. Cl.³ .............................................. H03F 3/26
[52] U.S. Cl. ..................................... 330/297; 330/262
[58] Field of Search ............... 330/149, 262, 267, 297, 330/273, 296, 310

[56] References Cited

U.S. PATENT DOCUMENTS 4,115,739  9/1978  Sano et al. ........................ 330/263

Primary Examiner—James B. Mullins
Assistant Examiner—G. Wan
Attorney, Agent, or Firm—Sughrue, Mion, Zinn, Macpeak and Seas

[57] ABSTRACT

A power amplifier includes a class A power amplifier and a class B power amplifier driven by the same input signal. The class A amplifier includes a pair of load driving power amplifying elements, and a further pair of amplifying elements serves to drive the power amplifying elements. To obtain good operating characteristics and reduce distortion, the further pair of elements are powered by power supplies for the class B amplifier.

5 Claims, 4 Drawing Figures

POWER AMPLIFIER

BACKGROUND OF THE INVENTION

The present invention relates to a power amplifier, and more particularly to a class A power amplifier for use in audio devices.

Amplifiers for delivering output power to loudspeakers or otherloads include class A and class B power amplifier circuits. The class A amplifier circuits have a pair of output amplifying elements which are in their active region at all times throughout the entire signal cycle. Since the output amplifying elements do not operate below a cutoff bias value, class A amplifier circuits suffer from no switching distortion. However, the bias currents are required to flow irrespective of whether input signals are applied or not, and hence class A amplifier circuits undergo much heat loss. The class B amplifier circuits, on the other hand, require a smaller bias current and are subjected to reduced heat loss as compared with the class A amplifier circuits. However, the class B amplifier circuits suffer from switching distortion as the output amplifying elements operate alternately below the cutoff bias value.

There have been proposed circuit arrangements designed to have the advantages, but eliminate the disadvantages of both the class A and B amplifiers, as shown in FIGS. 1 and 2 of the accompanying drawings. In FIG. 1, an input signal IN is amplified as to its voltage by a voltage amplifying stage 1, and the amplified signal is supplied to the bases of transistors $Q_1$, $Q_2$ in a complementary driver stage 2. The driver transistors $Q_1$, $Q_2$ produce emitter outputs which are applied respectively to the bases of output transistors $Q_3$, $Q_4$ of a complementary power amplifier stage 3. The output transistors $Q_3$, $Q_4$ then drive a load such as a loudspeaker $R_L$ connected between the commonly connected emitters thereof and ground. The circuits 1, 2 and 3 jointly constitute a class A power amplifier.

The voltage amplifying stage 1 and driver stage 2 of the class A power amplifier are supplied with operating power from power supplies $\pm B_1$ of small capacity suitable for processing small signals. The power amplifying stage 3 is supplied with power from a pair of floating voltage sources $\pm Eo/2$ that are connected in series with each other, so that a constant voltage Eo is applied across the power supply terminals or collector terminals a, b of the transistors $Q_3$, $Q_4$.

The circuit arrangement shown in FIG. 1 also includes a voltage amplifying stage 4 to which there is supplied an input signal which is the same as the input signal IN applied to the class A power amplifier, and a class B power amplifier stage 5 which is caused, by an amplified output from the voltage amplifying stage 4, to operate in a class B push-pull mode. The class B power amplifier stage 5 comprises a pair of transistors $Q_5$, $Q_6$ arranged in a single-ended push-pull connection for supplying an output to an intermediate junction between the floating power supplies $\pm Eo/2$. Power supplies $\pm B_2$ serve to supply power to the class B amplifier.

With such an arrangement, when the input signal is positive, the transistor $Q_5$ in the class B amplifier is turned on and the transistor $Q_6$ is turned off. Therefore, there appears at the emitter of the transistor $Q_5$ a power-amplified signal which is in phase with the input signal. Since this amplified signal is supplied to the intermediate junction between the power supplies $\pm Eo/2$, a voltage which is Eo/2 higher than the circuit output potential is imposed on the collector (a) of the output transistor $Q_3$ of the class A amplifier, and a voltage which is Eo/2 lower than the circuit output potential is applied to the collector (b) of the transistor $Q_4$. Such a voltage relationship also holds true when the input signal is negative. Therefore, the voltage across the collectors (a), (b) of the transistors $Q_3$, $Q_4$ of the class A push-pull amplifier is of a constant value Eo irrespective of the signals applied, and the collector-to-emitter voltage $V_{CE}$ of the transistors $Q_3$, $Q_4$ is maintained at $\pm Eo/2$. Thus, the output transistors $Q_3$, $Q_4$ undergo a power loss which is much smaller than that of the output transistors of conventional class A power amplifiers.

FIG. 2 shows a similar circuit arrangement. Like or corresponding parts are denoted by like or corresponding reference characters in FIGS. 1 and 2. According to the circuit shown in FIG. 2, a source of voltage Eo is connected across the power supply terminals (a), (b) of transistors $Q_3$, $Q_4$ of a class A push-pull amplifier. The outputs from the collectors of transistors $Q_5$, $Q_6$ of a class B push-pull amplifier are applied to both terminals of the source of voltage Eo. The transistors $Q_5$, $Q_6$ have emitters which are supplied with power from circuit power supplies $\pm B_2$. Resistors $R_1$, $R_2$ jointly constitute part of a negative feedback loop to an input of a voltage amplifying stage 4 for improved circuit characteristics of the class B amplifier.

The operation of such an arrangement is as follows: When the input signal is positive, the transistor $Q_6$ of the class B push-pull amplifier is turned on and the other transistor $Q_5$ is turned off. A signal which is in phase with and in power-amplified relation with the input signal then appears at the collector of the transistor $Q_6$. The signal is supplied to the collector (b) of the transistor $Q_4$, which is on the negative side of the class A push-pull amplifier, and a voltage which is higher by the signal level Eo is imposed on the collector (a) of the transistor $Q_3$ that is on the positive side. Therefore, a voltage Eo which is constant at all times is applied across the collectors (a), (b) of the transistors $Q_3$, $Q_4$, resulting in the high efficiency of the circuit arrangement as shown.

The voltage gains of the class A and B amplifiers shown in FIGS. 1 and 2 are selected so as to be substantially equal to each other.

When the transistors $Q_5$, $Q_6$ of the class B push-pull amplifier illustrated in FIGS. 1 and 2 become saturated, the loads $R_L$ are supplied with currents from the driver transistors $Q_1$, $Q_2$ through the base-emitter junctions of the transistors $Q_3$, $Q_4$ of the class A push-pull amplifiers. Such a mode of current supply tends to invite transistor failure or cause excessive distortion as the driver stages 2 are not designed to allow such currents to pass therethrough. Undue currents pass through the circuit power supplies $\pm B_1$, which are of limited capacity as they are to process small signals, with the result that the circuit operation becomes highly unstable.

SUMMARY OF THE INVENTION

It is an object of the present invention to provide a class A power amplifier which is stable in operation, of low distortion and high efficiency.

A power amplifier according to the present invention has a class A power amplifier circuit including a pair of power amplifying elements for driving a load, a source of voltage connected between power supply terminals of the power amplifying elements and having a certain voltage, and a class B amplifier circuit drivable by an input signal supplied to the class A power amplifier, which has a pair of output amplifying elements arranged in a push-pull connection and outputs connected respectively to the power supply terminals. The power amplifier is characterized in that amplifying elements serving as drivers for the pair of power amplifying elements are supplied with operating power from power supplies for the class B amplifier circuit.

BRIEF DESCRIPTION OF THE DRAWINGS

The present invention will now be described with reference to the drawings: in which.

DETAILED DESCRIPTION OF THE PREFERRED EMBODIMENTS

Figure 2:
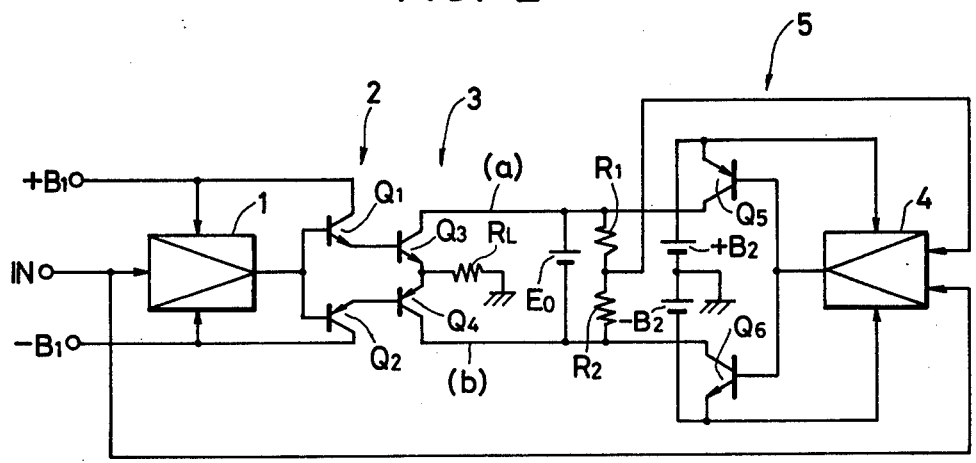
Figure 3:
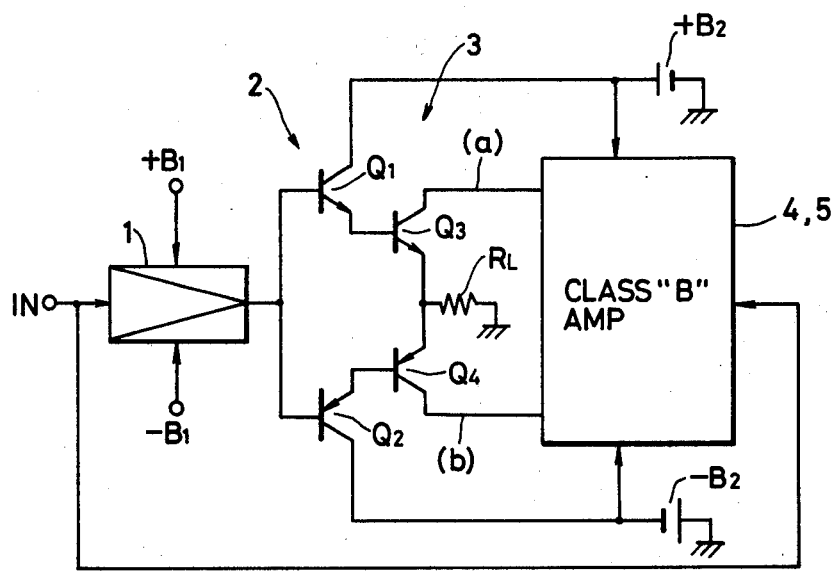
FIGS. 3 is a circuit diagram of a power amplifier according to an embodiment of the present invention.

FIG. 3 is a circuit diagram of a power amplifier according to an embodiment of the present invention. Like or corresponding parts shown in FIG. 3 are denoted by like or corresponding reference characters in FIGS. 1 and 2. The circuit arrangement of FIG. 3 is applicable to both the circuits illustrated in FIGS. 1 and 2. With the circuit shown in FIG. 3, the driver transistors $Q_1$, $Q_2$ of a driver stage 2 are supplied with power from circuit power supplies $\pm B_2$ for the class B power amplifier circuits 4, 5. The other arrangements are the same as those illustrated in FIGS. 1 and 2.

Figure 1:
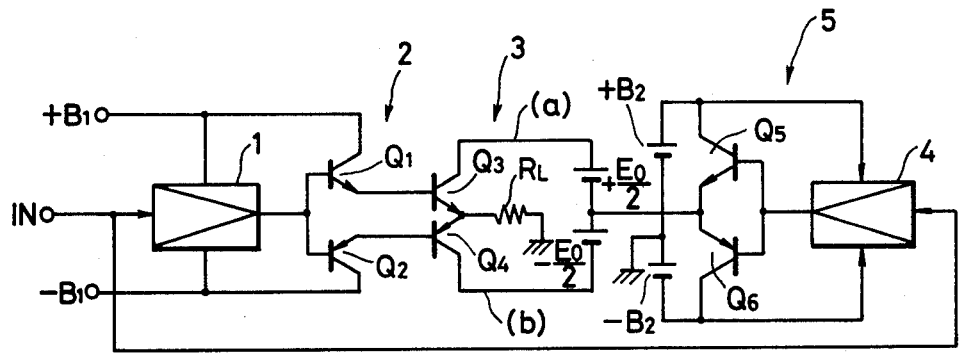
FIGS. 1 and 2 are circuit diagrams of high-efficiency class A amplifiers.

Since the power supplies $\pm B_2$ for the class B amplifier circuits are greater in level and in capacity than the power supplies $\pm B_1$ of the voltage amplifying stage 1 of the class A amplifier circuit, the ability to feed power to the driver stage 2 is larger than that in the circuits shown in FIGS. 1 and 2. Even when the transistors $Q_5$, $Q_6$ of the class B push-pull amplifier are saturated, the load $R_L$ can be fed with sufficient power from the driver transistors $Q_1$, $Q_2$ via the base-emitter junctions of the transistors $Q_3$, $Q_4$. Therefore, the power amplifier shown in FIG. 3 is subjected to no distortion, and will not become unstable in operation due to variations in the voltages of the power supplies or the like.

Figure 4:
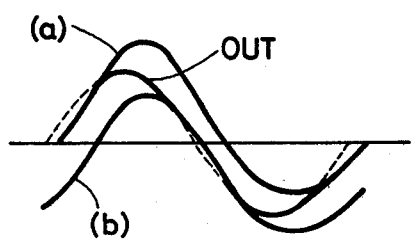
FIG. 4 is a diagram of output waveforms of the class A and B amplifiers illustrating an out-of-phase condition of the same.

When the outputs from the class A and B amplifier circuits are out of phase with each other, their signal waveforms are as shown in FIG. 4, and the output OUT from the class A amplifier circuit is clipped as illustrated (An unclipped output waveform is shown by the dotted line). In the invention, in such a condition, currents are supplied to the load $R_L$ from the transistors $Q_1$, $Q_2$ in the driver stage 2 through the base-emitter junctions of the output transistors $Q_3$, $Q_4$ of the class A amplifiers, preventing the current waveform from being clipped.

With the arrangement of the present invention, as described above, circuit operation is stabilized and distortions in output signals are greatly reduced simply by supplying power to the driver transistors from the power supplies for the class B amplifier circuits. The power amplifier illustrated in FIG. 3 however retains the high-efficiency and non-switching characteristics stemming from the circuit arrangements of FIGS. 1 and 2.

What is claimed is:
1. A power amplifier comprising:
   a class A power amplifier circuit including a pair of power amplifying elements having power supply terminals and output terminals wherein said power amplifying elements drive a load connected to said output terminals in response to control signals, amplifying elements serving as drivers for said power amplifying elements wherein said amplifying elements provide said control signals to said power amplifying elements, a voltage source connected between said power supply terminals of said power amplifying elements, and a voltage amplifying stage for receiving an input signal and for supplying an amplified output signal to said amplifying elements, said amplifying elements providing said control signals to said power amplifying elements in accordance with said amplified output signal;
   a class B amplifier circuit drivable by said input signal supplied to said voltage amplifying stage and including a pair of output amplifying elements arranged in a push-pull connection and having at least one output connected to said voltage source; and
   a power supply connected to supply operating power to said output amplifying elements and to said amplifying elements.
2. A power amplifier as claimed in claim 1, said class A power amplifier circuit being supplied with power from power supplies of relatively small capacity with respect to those of said class B amplifier circuit.
3. A power amplifier as claimed in claim 1, said voltage source comprising a single source connected between said supply terminals, a pair of resistors being arranged in parallel with said single source, and a midpoint of said resistors being fed back to an input of said class B amplifier circuit.
4. A power amplifier as claimed in claim 1, said voltage source comprising a pair of floating sources connected in series, an output of said class B amplifier circuit being connected between said floating sources.
5. A power amplifier as claimed in claim 4, said pair of output amplifying devices being arranged in a single ended push-pull fashion.

* * * * *